United States Patent [19]
Toshitani et al.

[11] Patent Number: 6,118,344
[45] Date of Patent: Sep. 12, 2000

[54] FREQUENCY CONTROL APPARATUS AND METHOD AND STORAGE MEDIUM STORING A PROGRAM FOR CARRYING OUT THE METHOD

[75] Inventors: Masafumi Toshitani; Kinya Inoue; Hiromi Imura; Hitoshi Koseki; Sadayuki Narusawa; Shuichi Esaki, all of Hamamatsu, Japan

[73] Assignee: Yamaha Corporation, Hamamatsu, Japan

[21] Appl. No.: 09/160,678

[22] Filed: Sep. 25, 1998

[30] Foreign Application Priority Data

Sep. 30, 1997 [JP] Japan .................................. 9-266192
Sep. 30, 1997 [JP] Japan .................................. 9-266193

[51] Int. Cl.⁷ .................................................. H03L 7/00
[52] U.S. Cl. ........................... 331/1 R; 331/65; 327/155; 365/233
[58] Field of Search ............................... 331/1 R, 65, 17, 331/25; 327/156–159, 155; 360/51; 365/233

[56] References Cited

U.S. PATENT DOCUMENTS 5,923,220  7/1999  Honma ....................................... 331/17

*Primary Examiner*—David Mis
*Attorney, Agent, or Firm*—Pillsbury Madison & Sutro LLP

[57] ABSTRACT

A frequency control apparatus controls the frequency of an output signal thereof in synchronism with an externally input timing signal. A variable frequency oscillator generates the output signal such that the output signal has a frequency thereof variable in response to a control signal input to the variable frequency oscillator. An input device receives the timing signal. A checking device checks a monitor amount variable in response to the frequency of the output signal from the variable frequency oscillator, in timing in which the timing signal is input. A calculating device calculates a difference between the checked monitor amount and a predetermined desired amount. A control device controls the control signal input to the variable frequency oscillator such that the calculated difference becomes zero.

17 Claims, 16 Drawing Sheets

FREQUENCY CONTROL APPARATUS AND METHOD AND STORAGE MEDIUM STORING A PROGRAM FOR CARRYING OUT THE METHOD

BACKGROUND OF THE INVENTION

1. Field of the Invention

The present invention relates to a frequency control apparatus and method which controls the frequency of an output signal thereof in synchronism with an externally input timing signal, and a storage medium storing a program for carrying out the method.

2. Prior Art

Conventionally, as a system for generating an output signal which is controlled in frequency in synchronism with an input signal applied thereto, a PLL (phase lock loop) is known. A typical PLL is essentially comprised of a phase comparator which compares the phase of an input signal and the phase of an output signal (regenerated clock signal), a loop filter which smoothes the output of the phase comparator, and a VCO (voltage controlled oscillator) which outputs the regenerated clock signal varying in frequency in response to the output of the loop filter. Further, in the case of regenerating a sampling clock having a frequency of 44.1 kHz in synchronism with an input signal having a frequency of 1 kHz, for example, a frequency divider, which reduces the frequency from 44.3 kHz to 1 kHz, is provided in a feedback loop to the phase comparator.

In a conventional PLL, all of the component elements are implemented by hardware, which leads to an increasing number of component elements. This is particularly true where many frequency dividing steps are used, resulting in a complicated construction. Moreover, in the conventional PLL, the input signal (data) entering response depends upon the time constant of the loop filter which cannot be easily changed. Consequently, if the input frequency differs greatly from the output frequency (e.g., input frequency << output frequency), much time is necessary to enter the input signal. Further, in the conventional PLL, the component elements are selected for a particular input frequency/output frequency ratio. Therefore, the PLL cannot flexibly cope with input and output signals having a different frequency ratio.

Further, where the PLL is applied to an apparatus constructed such that a synchronizing signal as a timing signal is input from the personal computer or a like (hereinafter referred to as "PC") and an internal VCO is controlled in synchronism with the input synchronizing signal, if the synchronizing signal is not supplied with the power supply to PC off or a bus disconnected, the output frequency changes, causing a change in the operative state of the apparatus which operates in synchronism with the synchronizing signal. Moreover, when the power supply to PC is again turned on, there occurs a large difference between the input frequency and the output frequency. As mentioned above, in the conventional PLL, the input signal (data) entering response depends upon the time constant of the loop filter, and the time constant must be set to a rather large value so as to secure stability of the output frequency. Therefore, if there is a large difference between the input frequency and the output frequency, much time is needed to enter the input signal.

SUMMARY OF THE INVENTION

It is therefore a first object of the invention to provide a frequency control apparatus and method, which requires a simple circuit configuration and is capable of entering an input signal at a high speed, as well as flexibly coping with input and output signals having various frequency ratios, and a storage medium storing a program for carrying out the method.

It is a second object of the invention to provide a frequency control apparatus and method, which requires a simple circuit configuration and is capable of entering an input signal at a high speed, as well as maintaining an output frequency which was obtained in synchronism with a synchronizing signal even when the synchronizing signal is not input, and a storage medium storing a program for carrying out the method.

To attain the first object, according to a first aspect of the present invention, there is provided a frequency control apparatus for controlling a frequency of an output signal thereof in synchronism with an externally input timing signal, comprising a variable frequency oscillator that generates the output signal such that the output signal has a frequency thereof variable in response to a control signal input to the variable frequency oscillator, an input device that receives the timing signal, a checking device that checks a monitor amount variable in response to the frequency of the output signal from the variable frequency oscillator, a calculating device that calculates a difference between the checked monitor amount and a predetermined desired amount, and a control device that controls the control signal input to the variable frequency oscillator such that the calculated difference becomes zero.

With the above arrangement according to the first aspect, the monitor amount is checked in timing in which the timing signal, as a reference signal, for synchronization is input, while varying the monitor amount in response to the frequency of the output signal, from the variable frequency controller. The difference between the checked monitor amount and the desired amount is determined. The control signal input to the variable frequency oscillator, i.e. the oscillation frequency thereof, is controlled so as to make zero the difference. As a result, checking of the monitor amount, calculation of the difference between the monitor amount and the desired amount, and calculation of the controlled variable of the variable frequency oscillator can all be implemented by software. This enables a large reduction in the number of required component elements for the frequency control apparatus. Further, the amount of deviation of the output frequency of the variable frequency oscillator in both positive and negative directions can be directly determined from the difference between the monitor amount and the desired amount. This enables prompt synchronization of the output frequency with the timing signal to thereby promptly minimize or make zero the deviation amount. Since the frequency ratio between the input signal and the output signal is determined by the desired value of the monitor amount at the time of inputting the timing signal from an external device, the frequency ratio between the input signal and the output signal can be easily changed by varying the desired value.

In the case where predetermined data are input together with the external timing signal, a storage device for temporarily storing the data may be provided, and then a residual amount of data stored in the storage device can be used as the monitor amount.

That is, in a preferred form of the first aspect of the invention, the frequency control apparatus comprises a variable frequency oscillator that generates the output signal such that the output signal has a frequency thereof variable in response to a control signal input to the variable frequency oscillator, a storage device that stores externally input data, an output device that outputs the stored data based on the output signal from the variable frequency oscillator, an input device that receives the timing signal input in synchronism with inputting of the data, a checking device that checks as a monitor amount a residual amount of data stored in the storage device, in timing in which the timing signal is input, a calculating device that calculates a difference between the checked residual amount of data and a predetermined desired amount, and a control device that controls the control signal input to the variable frequency oscillator such that the calculated difference becomes zero.

With the above arrangement, the residual amount of data stored in the storage device is checked as the monitor amount in timing of inputting of the timing signal, and the output frequency of the variable frequency oscillator is controlled based on the difference between the residual data amount and the desired residual amount. As a result, any form of data may be input within one period of the timing signal (e.g. burst-like data). If only the desired output sampling rate is previously determined, data can be easily output at a constant output sampling rate synchronous with the timing signal by determining the desired residual amount based on the period of the timing signal.

In this case, the residual data amount can be determined from a difference in position between a write pointer and a read pointer by advancing the write pointer by 1 whenever the data is stored in the storage device, and advancing the read pointer by 1 whenever the data is read from the storage device.

As the monitor amount, a count value of a counter device that counts the output signal of the variable frequency oscillator may be used. If the count value is used, the output frequency synchronized with the timing signal can be obtained irrespective of whether data are input together with the timing signal.

The control device may be desirably constructed with the implementation by software taken into consideration, such that the variable frequency oscillator is controlled based on a pulse width controlled signal having a pulse width corresponding to the difference between the monitor amount and the desired amount. Further, the control device may vary the frequency of the output signal from the variable frequency oscillator linearly in response to the the difference between the monitor amount and the desired amount, or it may vary the frequency non-linearly in response to the difference. If the frequency is non-linearly varied, it is preferable to set the maximum controlled variable for the variable frequency oscillator if the deviation of the monitor amount from the desired amount exceeds a certain range, to thereby further enhance the response speed in entering the input signal.

The first aspect of the invention can be implemented by software.

More specifically, there is also provided a frequency control method for controlling a frequency of an output signal thereof in synchronism with an externally input timing signal, comprising a variable frequency oscillating step of generating the output signal such that the output signal has a frequency thereof variable in response to an input control signal, an input step of receiving the timing signal, a checking step of checking a monitor amount variable in response to the frequency of the output signal generated by the variable frequency oscillating step, in timing in which the timing signal is input, a calculating step of calculating a difference between the checked monitor amount and a predetermined desired amount, and a control step of controlling the input control signal such that the calculated difference becomes zero.

Further, a mechanically readable storage device that stores a program for carrying out the above frequency control method according to the first aspect is provided.

To attain the second object, according to a second aspect of the invention, there is provided a frequency control apparatus for controlling a frequency of an output signal thereof in synchronism with an externally input timing signal, comprising a variable frequency oscillator that generates the output signal such that the output signal has a frequency thereof variable in response to a control signal input to the variable frequency oscillator, an input device that receives the timing signal, a storage device that stores a period of the timing signal when the timing signal is input to the input device, a counter device that counts the output signal from the variable frequency oscillator, a checking device that checks a count value of the counter device obtained by counting the output signal, a calculating device that calculates a difference between the checked count value and a predetermined desired value, and a control device that controls the control signal input to the variable frequency oscillator such that the calculated difference becomes zero. When the timing signal is input to the input device, the checking device checks the count value in timing in which the timing signal is input. When the timing signal is not input to the input device, the checking device checks the count value with a period corresponding to the period of the timing signal stored in the storage device when the timing signal was input to the input device.

With the above arrangement according to the second aspect, the output signal of the variable frequency oscillator is counted. When the timing signal is input to the input device from an external device, the count value is checked in timing in which the timing signal is input, the difference between the checked count value and the desired value is determined, and the oscillation frequency of the variable frequency oscillator is controlled so as to make zero the difference. On the other hand, when the timing signal is not input, the count value is checked with a period corresponding to the period of the timing signal stored in the storage device when the timing signal was input to the input device. As a result, according to the second aspect, counting of the output of the oscillator, calculation of the difference between the count value and the desired value, and calculation of the controlled variable of the variable frequency oscillator can all be implemented by software, thereby enabling a large reduction in the number of required component elements. Further, since when the timing signal is not input from the external device, the count value is checked with a fixed period corresponding to the period of the timing signal which was obtained when the timing signal was input, as if the timing signal were currently input, to control the output frequency of the variable frequency oscillator, the output frequency of the variable frequency oscillator can be stably maintained at a frequency at which the output frequency of the variable frequency oscillator was last synchronized with the external timing signal. Moreover, when the bus is again connected, the frequency at the time the bus was disconnected can be maintained, thereby enabling prompt resumption of the synchronizing operation.

If the frequency control apparatus further includes a fixed frequency oscillator having a fixed output frequency, and a switch device that switches from the output of the variable frequency oscillator to the output of the fixed frequency oscillator when the timing signal is not input, an output signal having any desired frequency synchronous with the timing signal can be obtained when the timing signal is input, while an output signal having a precise fixed frequency can be obtained on which an apparatus with the frequency control apparatus installed therein can operate for itself. As a result, depending upon the presence of the timing signal input, the frequency control apparatus can be selectively used as an apparatus synchronized in operation with a PC as an independent apparatus operating on its own precise reference signal.

The second aspect of the invention can also be implemented by software.

More specifically, there is also provided a frequency control method for controlling a frequency of an output signal thereof in synchronism with an externally input timing signal. The method comprises a variable frequency oscillating step of generating the output signal such that the output signal has a frequency thereof variable in response to an input control signal, an input step of receiving the timing signal, a storage step of storing a period of the timing signal when the timing signal is input at the input step, a counting step of counting the output signal generated by the variable frequency oscillating step, a checking step of checking a count value obtained by the counting step, a calculating step of calculating a difference between the checked count value and a predetermined desired value, and a control step of controlling the control signal input such that the calculated difference becomes zero. When the timing signal is input at the input step, the checking step checks the count value in timing in which the timing signal is input. When the timing signal is not input at the input step, the checking step checks the count value with a period corresponding to the period of the timing signal stored by the storage step when the timing signal was input at the input step.

Further, a mechanically readable storage device that stores a program for carrying out the above frequency control method according to the second aspect is provided.

The above and other objects, features, and advantages of the invention will become more apparent from the following detailed description taken in conjunction with the accompanying drawings.

BRIEF DESCRIPTION OF THE DRAWINGS

FIGS. 7A and 7B are graphs showing the relationship between a difference ΔR obtained by the frequency control apparatus and the width of a control pulse generated in response to the difference ΔR, in which:

FIG. 7A shows a linear relationship between the difference ΔR and the pulse width; and FIG. 7B shows a non-linear relationship between the difference ΔR and the pulse width;

FIGS. 8A and 8B are graphs similar to FIGS. 7A and 7B, showing the relationship between the difference ΔR and the duty factor of a control pulse, in which:

FIG. 8A shows a linear relationship between the difference ΔR and the duty factor; and FIG. 8B shows a non-linear relationship between the difference ΔR and the duty factor;

FIGS. 16A and 16B are graphs showing the relationship between a difference ΔN obtained by the frequency control apparatus of FIG. 11 and the width of a control pulse generated in response to the difference ΔN, in which:

FIG. 16A shows a linear relationship between the difference ΔN and the pulse width; and FIG. 16B shows a non-linear relationship between the difference ΔN and the pulse width;

FIGS. 17A and 17B are graphs similar to FIGS. 16A and 16B, showing the relationship between the difference ΔN and the duty factor of a control pulse, in which:

FIG. 17A shows a linear relationship between the difference ΔN and the duty factor; and FIG. 17B shows a non-linear relationship between the difference ΔN and the duty factor;

DETAILED DESCRIPTION OF THE PREFERRED EMBODIMENTS

The invention will be described in detail with reference to the drawings showing preferred embodiments thereof.

Figure 1:
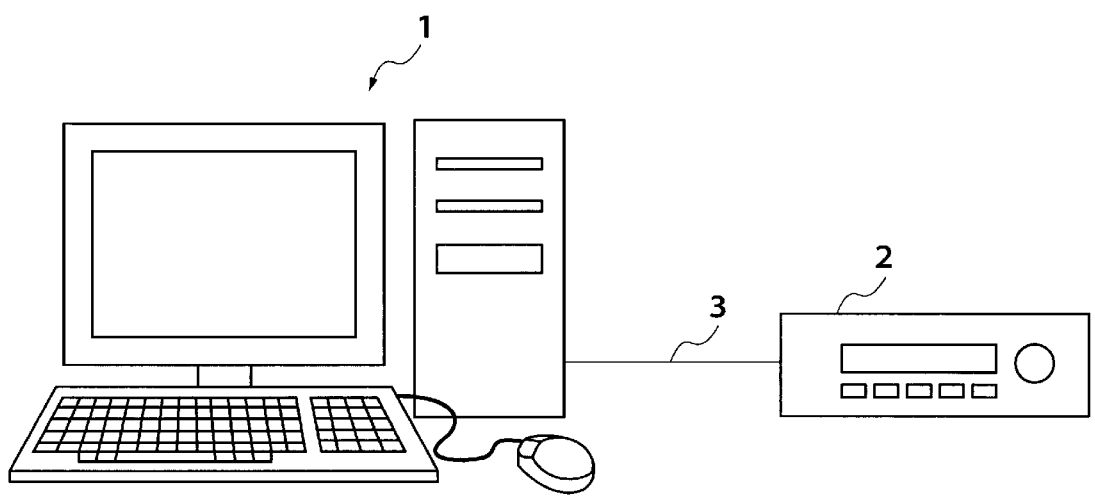
FIG. 1 is a view showing the appearance of a system to which a frequency control apparatus or method according to a first embodiment of the invention is utilized.

FIG. 1 shows the appearance of a system to which a frequency control apparatus or method according to a first embodiment of the invention is utilized;

In FIG. 1, a computer 1, which provides a timing signal (synchronizing signal) as a reference signal for synchronization, and an apparatus 2, which operates in synchronism with an output or the timing signal of the computer 1, are connected to each other via a signal cable 3 such as a cable according to USB (Universal Serial Bus). The apparatus 2, which operates in synchronism with the output of the computer 1, may be, for example, a simple audio stereo apparatus which receives musical data from the computer 1 and generates musical tones. The frequency control apparatus according to the invention is provided in the apparatus 2.

Figure 2:
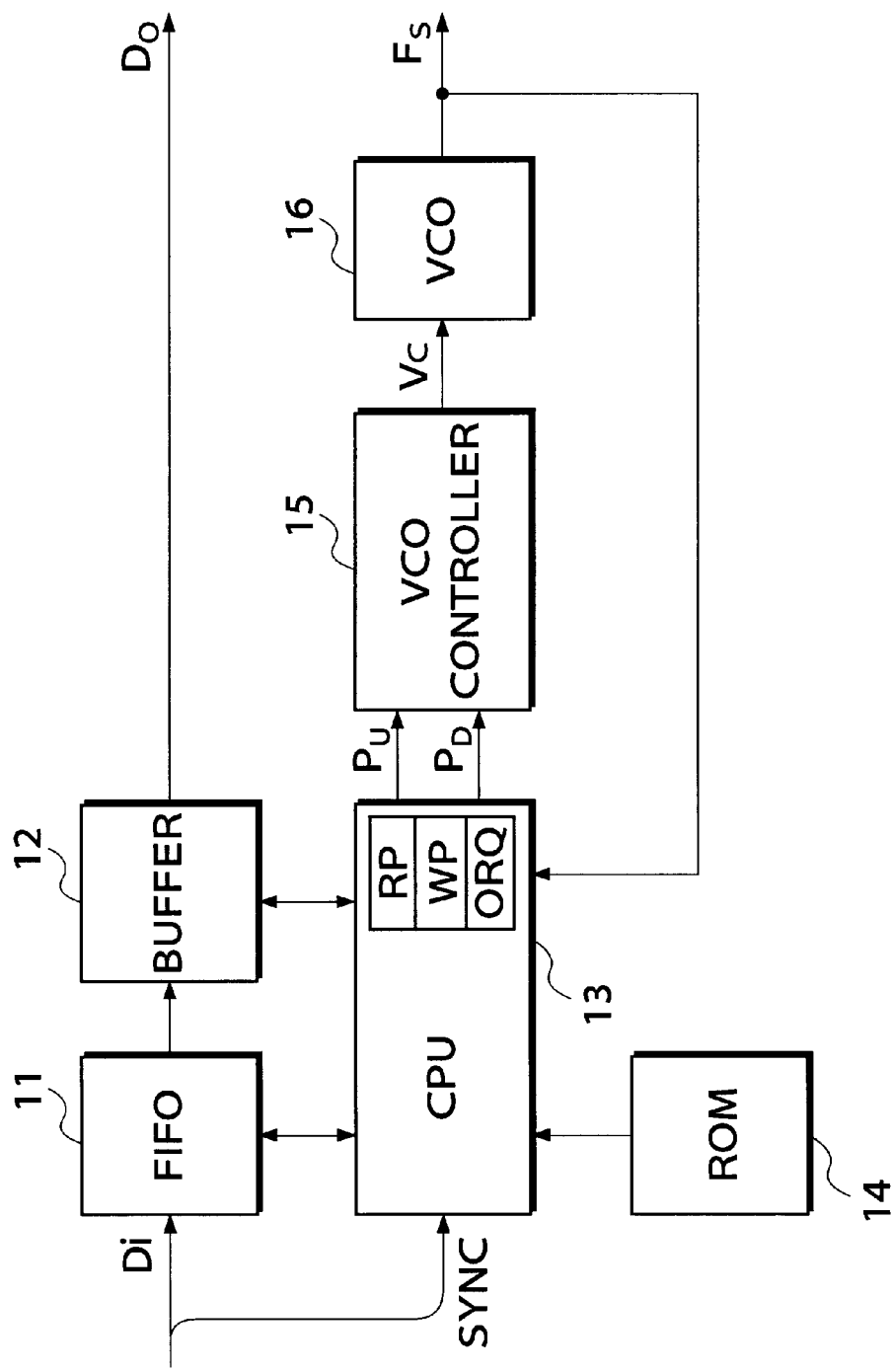
FIG. 2 is a block diagram showing the arrangement of the frequency control apparatus used in the system of FIG. 1.

FIG. 2 shows an example of the arrangement of the above frequency control apparatus.

The frequency control apparatus comprises of a FIFO (First In First Out) memory (hereinafter referred to as "FIFO") 11 and a buffer 12 as data storage means, a CPU 13, ROM 14 and VCO controller 15 as control means, and a VCO 16 as a variable frequency oscillator.

Figure 3:
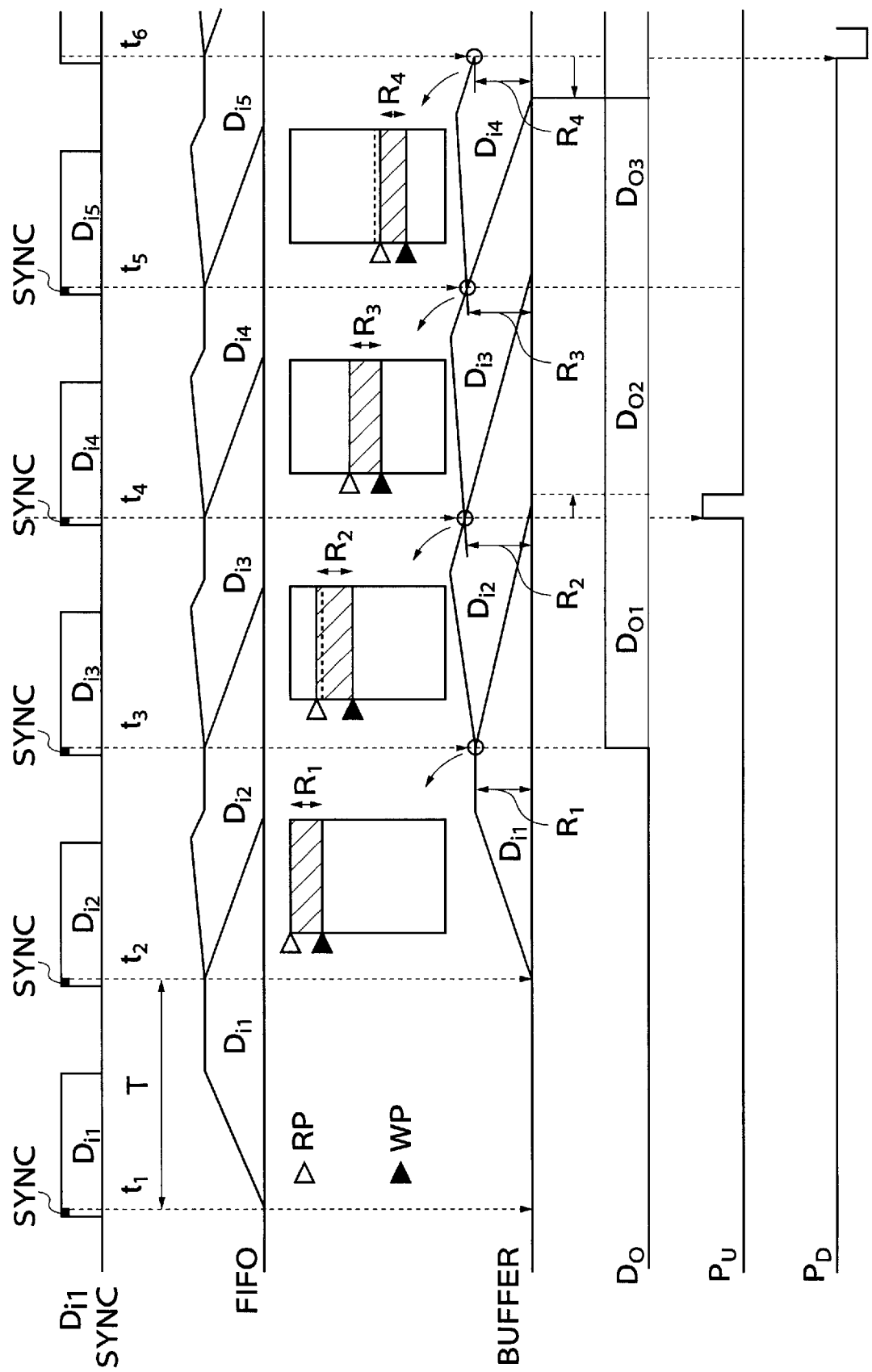
FIG. 3 is a timing chart showing changes in input data to the frequency control apparatus of FIG. 2 and states of devices of the same.

FIG. 3 shows input data Di and a synchronizing signal (hereinafter referred to as "SYNC signal"), which are input to the frequency control apparatus. The SYNC signal serves as a timing signal for use as a reference signal for synchronization on a data bus. According to USB Standard, a synchronizing signal of this kind is referred to as a SOF (Start of Frame) signal.

The input data Di which is in the form of a burst and which follows the SYNC signal is first stored in the FIFO 11, and then stored in the buffer 12 and output therefrom in predetermined timing as output data Do under control of the CPU 13. The CPU 13 operates on a microprogram stored in the ROM 14 to execute read/write control with respect to the buffer 12 at regular time intervals, check a residual amount of data stored in the buffer 12 as a monitor amount whenever the SYNC signal is input as an interrupt signal from the external device or computer 1 every period T, control an up pulse $P_U$ or a down pulse $P_D$ through PWM (pulse width modulation) based on the difference between the checked residual data amount and a desired residual amount, and deliver the up pulse or down pulse to the VCO controller 15. The VCO controller 15 controls the oscillation frequency of the VCO 16 based on the up pulse $P_U$ or down pulse $P_D$. An output of the VCO 16 is delivered as an output sampling signal Fs synchronous with the output data Do to a subsequent stage, for example, a D/A converter for digital-to-analog conversion of the output data Do, and also delivered to the CPU 13 to give timing for reading data from the buffer 12.

The CPU 13 has internal registers, not shown, which store a read point RP and write pointer WP for reading and writing data from and into the buffer 12, as well as an output request flag ORQ which is set or made active by the output of the VCO 16. Further, the CPU 13 has an internal register, not shown, which stores a residual amount of data stored in the FIFO 11.

FIG. 3 also shows the residual amounts of data stored in the FIFO 11 and the buffer 12 and output timing of the up and down pulses $P_U$, $P_D$ in relation to input timing of the data Di and SYNC signal.

The number of data to be output within a time period corresponding to the period T of inputting the SYNC signal is determined by the output sampling rate Fs. For example, if the period T is 1 ms and the output sampling rate Fs is 44.1 kHz, data of 44 bits are output at regular time intervals within the time period corresponding to the period T. In the illustrated example, it is assumed that one group of input data Di following a SYNC signal are data of 44 bits. The amount of input data Di, however, may be a different amount insofar as it is within a range allowable for the capacity of the buffer 12, e.g., it may be variable length code data.

Each SYNC signal serves as an interrupt signal for interrupting processing by the CPU 13. The CPU 13 is triggered by each SYNC signal to execute various processes such as checking the residual data amount of the buffer 12, determining the output frequency of the VCO 16 based on the checked residual data amount, and fetching the residual data amount of the FIFO 11.

Figure 4:
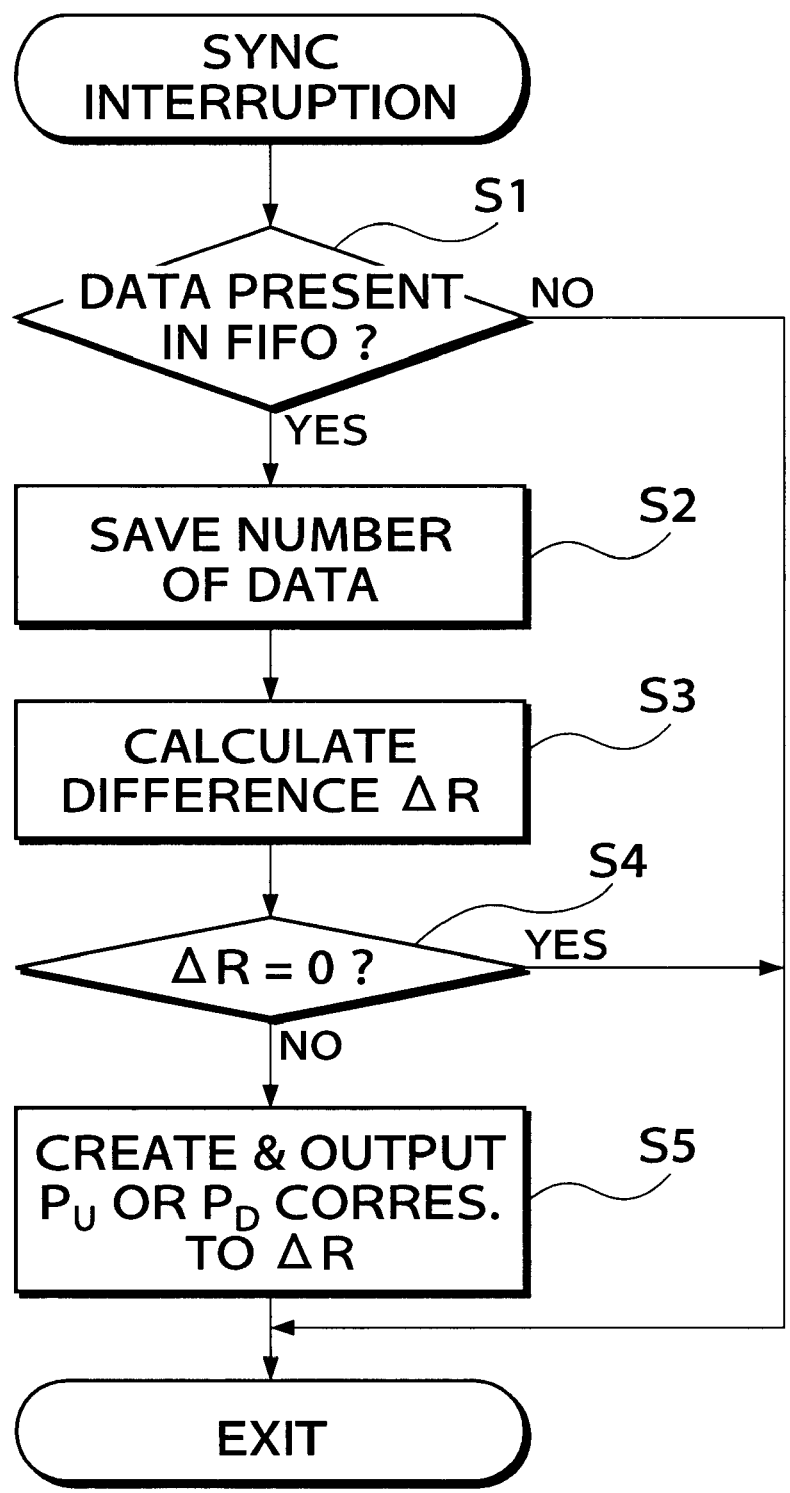
FIG. 4 is a flowchart showing an interrupt handling routine triggered by an interrupt signal generated upon inputting of a synchronizing signal (SYNC signal) to the frequency control apparatus.

FIG. 4 shows a routine for carrying out the above-mentioned processes which are executed by the CPU 13 as an interrupt handling routine triggered by each SYNC signal.

When an interruption occurs upon inputting of the SYNC signal, the CPU 13 first checks whether data are present in the FIFO 11 at a step S1. If no data is present, the routine is immediately terminated. If data are present, the CPU 13 saves the number of data stored in the FIFO 11 at a step S2. Then, the CPU 13 calculates a difference $\Delta R$ between the residual data amount R of the buffer 12 and the desired residual amount $R_0$ at a step S3. The residual data amount R of the buffer 12 and the difference $\Delta R$ are determined as follows:

Residual Data Amount R=Write Pointer WP−Read Pointer RP

Difference $\Delta R$=Residual Data Amount R−Desired Residual Amount $R_0$

If the difference $\Delta R$ is equal to 0 at a step S4, the routine is immediately terminated. If the difference $\Delta R$ is not equal to 0, a PWM pulse $P_U$ or $P_D$ of an appropriate pulse width corresponding to the difference $\Delta R$ is created and delivered to the VCO controller 15 at a step S5. More specifically, if the difference $\Delta R$ has a positive value (e.g., the residual data amount is larger, as at a time point t4 in FIG. 3), it is determined that the speed of outputting data is low, and an up pulse $P_U$ is generated. On the other hand, if the difference $\Delta R$ has a negative value (e.g., the residual data amount is smaller as at a time point t6 in FIG. 3), it is determined that the speed of outputting data is high, and a down pulse $P_D$ is generated. The pulse width of up and down pulses $P_U$, $P_D$ is set to a value proportional to the absolute value of the difference $\Delta R$. The residual data amount R and the desired residual amount Ro may be expressed or handled not only in terms of the number of bits but also in terms of the number of bytes. For example, in the case of stereo audio data of 16 bits, if one sample is equal to 4 bytes and the output sampling rate is 44.1 kHz, the desired residual amount $R_0$ per the period of 1 ms is equivalent to 176 bytes.

Figure 5:
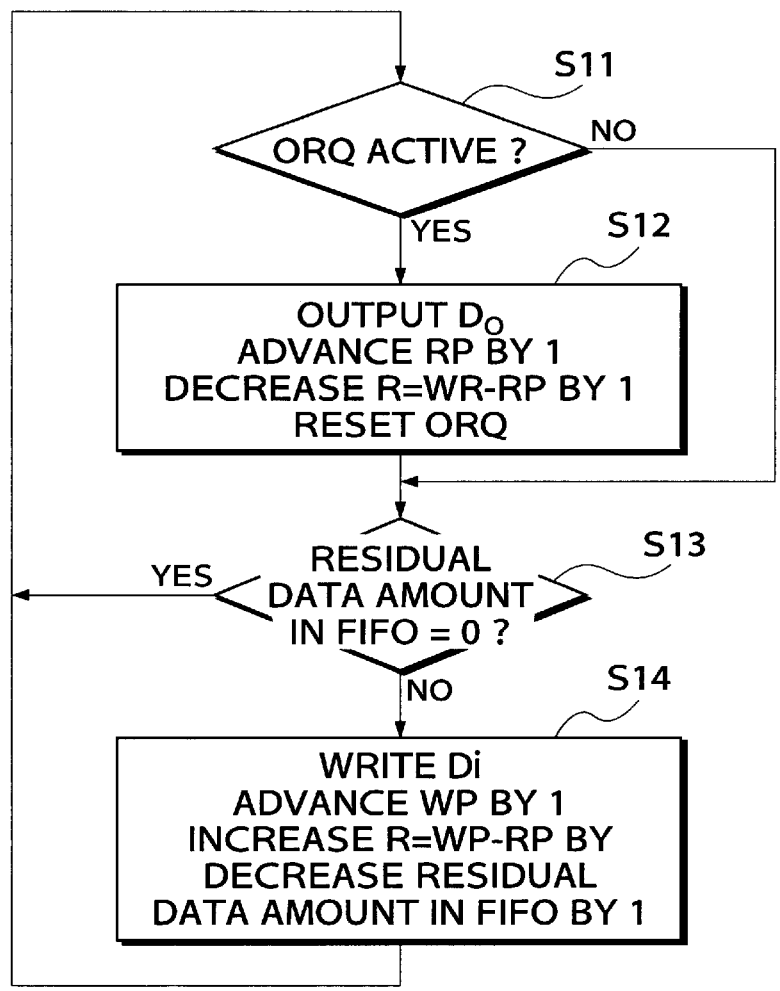
FIG. 5 is a flowchart showing an ordinary routine executed by the frequency control apparatus.

FIG. 5 shows a process which is repeatedly executed by the CPU 13 within the period T between inputting of a SYNC signal and the next SYNC signal. This process is repeatedly executed with a period shorter than T/N if the amount of data input within the period T is designated by N.

First, it is determined at a step S11 whether or not the output request flag ORQ is active, that is, whether or not the output of the VCO 16 has just been input to the CPU 13. If the flag ORQ is active, one bit of data is read from the buffer 12 as output data Do, the read point RP is advanced by 1, which decreases the residual data amount (R=WP−RP) by 1, and and then the flag ORQ is reset at a step S12. If the flag ORQ is inactive, the above process is not carried out. Then, it is determined whether or not the residual data amount of the FIFO 11 is equal to 0 at a step S13. If the residual data amount is not equal to 0, data Di is written into the buffer 12, and the write pointer WP is advanced by 1, which increases the residual data a amount (R=WP−RP) by 1, and at a step S14. If the residual data amount of the FIFO 11 is equal to 0, the above process is not carried out (S13→S11).

By process described in FIG. 5, data Di1 input immediately following a SYNC signal starts to be stored in the FIFO 11 at a time point t1, as shown in FIG. 3, and all the data Di1 are stored in the FIFO 11 before the next SYNC signal is input at a time point t2. At the time point t2 inputting of the next SYNC signal, the data Di1 stored in the FIFO 11 begins to be stored in the buffer 12 by the CPU 13. As the data Di1 is stored in the buffer 12, the write pointer WP is progressively advanced. At the same time, the next data Di2 is progressively stored in the FIFO 11. When all the data Di1 are read from the FIFO 11 by the CPU 13 so that the residual amount of data Di1 in the FIFO 11 becomes zero, the transfer of data from the FIFO 11 into the buffer 12 stops. At a time point t3 at which the next SYNC signal is input, a residual data amount R1 in the buffer 12 is determined from the difference between the write pointer WP and read pointer RP of the buffer 12, and the CPU 13 controls the VCO 16 via the VCO controller 15, based on the difference $\Delta R$ between the determined residual data amount R1 and the desired residual amount $R_0$, to thereby determine the output sampling rate Fs.

The output sampling signal Fs from the VCO 16 causes the output request flag ORQ to be set or made active. In response, the CPU 13 reads one bit of data from the buffer 12 and advances the read pointer RP by 1.

By the above process, as indicated by hatched areas in FIG. 3, it is controlled so that a constant residual amount of data is always stored in the buffer 12 at a time point of inputting of each SYNC signal, whereby the output data Do is synchronized in frequency with the SYNC signal.

Figure 6:
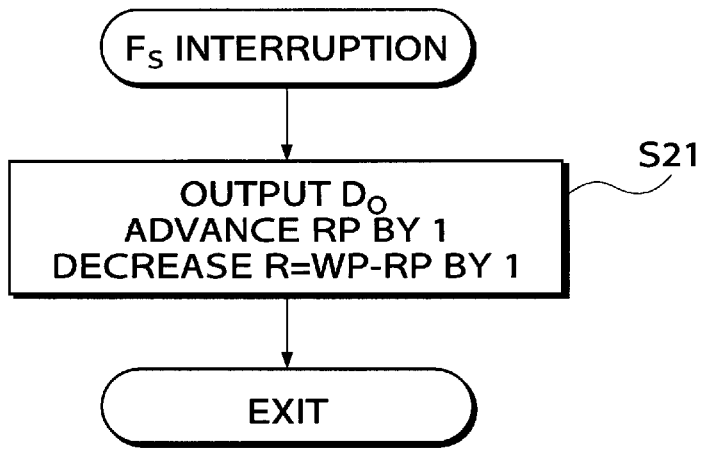
FIG. 6 is a flowchart an interrupt handling routine which replaces a portion of the routine of FIG. 5 to be executed alternatively thereto.

Outputting of data from the buffer 12 needs not necessarily be carried out in response to the output request flag ORQ as in the above described embodiment. It may be carried out according to interrupt processing by the CPU 13. For example, as shown in FIG. 6, when an interruption occurs by the output sampling signal Fs, the CPU 13 causes data Do to be output, and advances the read pointer RP by 1, which decreases the residual data amount R by 1 (step S21). If this alternative method is employed, the FIG. 5 process is modified such that only the steps S13 and S14 are executed repeatedly within the period between adjacent SYNC signals.

Figure 7A:
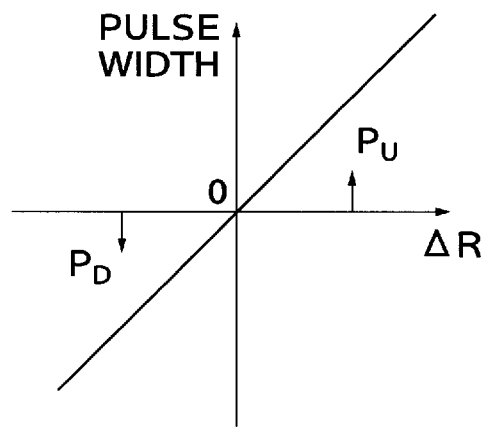
Figure 7B:
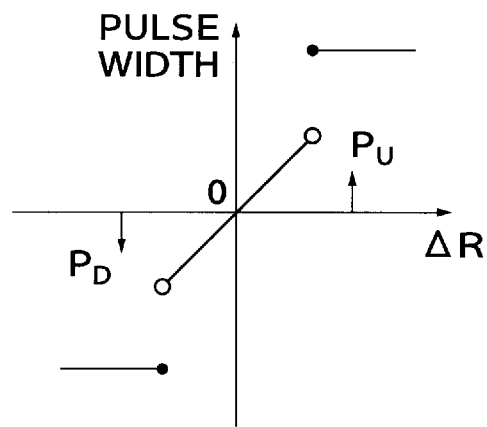

The up pulse PU and down pulse PD generated by the CPU 13 vary in pulse width in a linear manner in response to the difference $\Delta R$, as shown in FIG. 7A. Alternatively, they may vary in a non-linear manner such that when the difference $\Delta R$ exceeds a certain range, the pulse width is held at a maximum level, as shown in FIG. 7B. This has an advantage of further shortening the input signal entering time. In FIG. 7B, the right side (in the positive direction of $\Delta R$) shows the output range of the up pulse $P_U$, and the left side (in the negative direction of $\Delta R$) the output range of the down pulse $P_D$. If the pulse width is determined from a table, the ROM 14 may store only a table of the pulse width to $\Delta R$ relationship shown in the first quadrant of the FIG. 7A or 7B graph. An absolute value $|\Delta R|$ of the difference $\Delta R$ is obtained. The up pulse or the down pulse is selected to determine its pulse width depending upon the sign of the difference $\Delta R$, whereby the ROM capacity required for storing the table can be reduced to half.

Figure 8A:
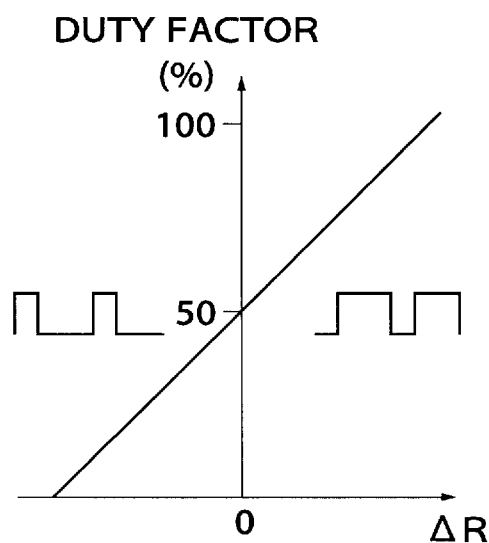
Figure 8B:
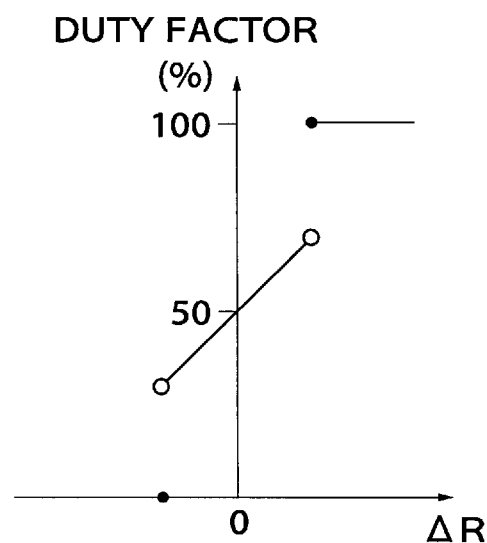

Further, instead of the up and down pulses $P_U$, $P_D$, a pulse whose duty factor varies from 0% to 100% as the difference $\Delta R$ changes from its minimum value to its maximum value may be used as a control signal for controlling the VCO 16, as shown in FIGS. 8A and 8B. This way, the VCO 16 can be controlled by only the use of a single control signal and hence the number of ports of the CPU 13 can be reduced.

Figure 9:
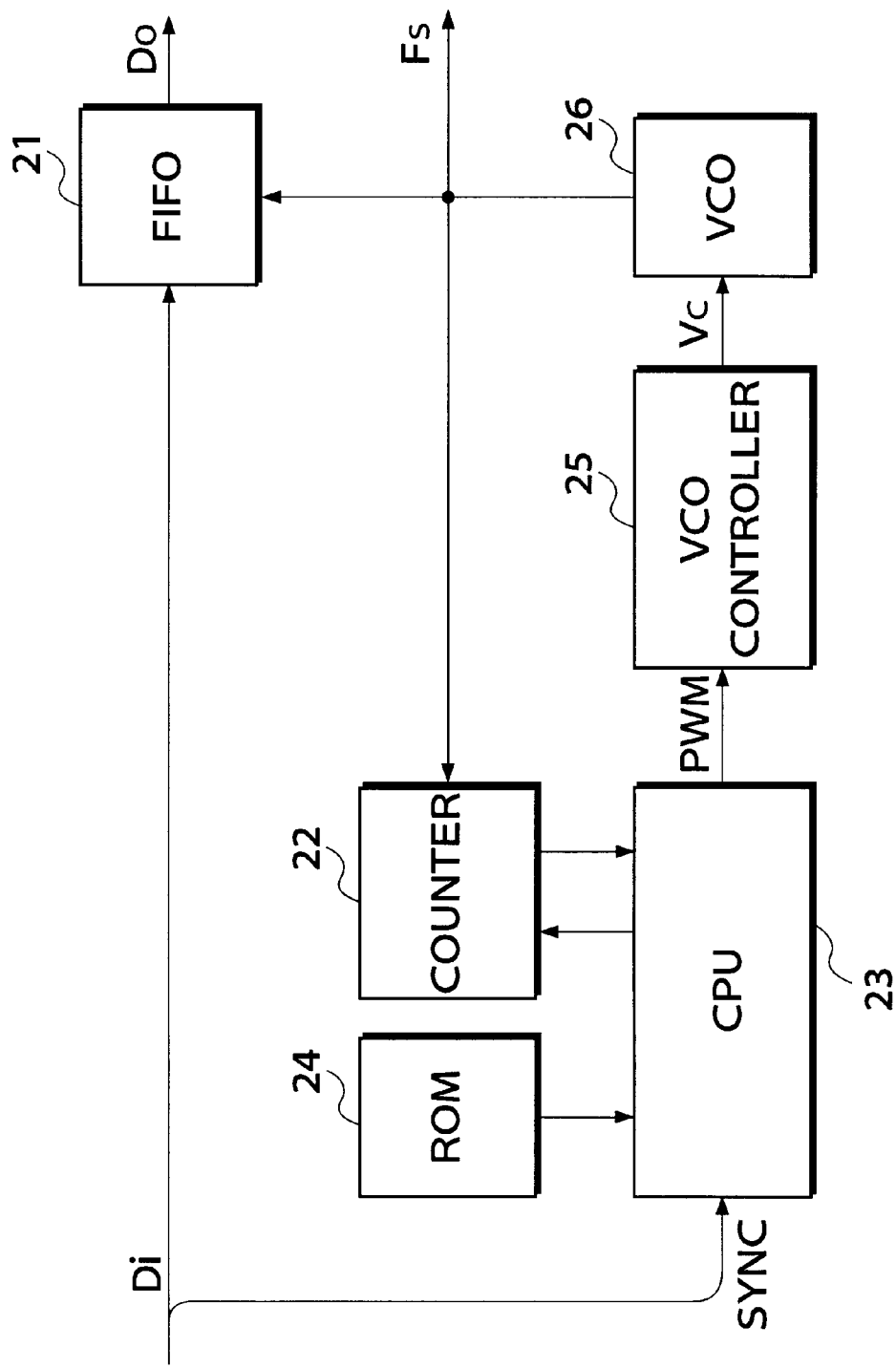
FIG. 9 is a circuit diagram showing the configuration of a frequency control apparatus according to a second embodiment of the invention.

FIG. 9 shows the configuration of a frequency control apparatus according to a second embodiment of the invention.

The frequency control apparatus according to the second embodiment comprises of a FIFO 21 as data storage means, a counter 22, a CPU 23, a ROM 24, and a VCO controller 25 as control means, and a VCO 26 as a variable frequency oscillator.

This embodiment uses the count value of the counter 22 as a monitor amount. More specifically, input data Di are stored in the FIFO 21, and output from the FIFO 21 in synchronism with an output sampling signal Fs from the VCO 26. The output sampling signal Fs is also delivered as a clock to the counter 22. In an interrupt handling process triggered by a SYNC signal which is input with a constant period, the CPU 23 fetches the count value of the counter 22, and outputs a control signal PWM for increasing the output frequency of the VCO 26 when the count value is smaller than a desired value, while it outputs a control signal PWM for decreasing the output frequency of the VCO 26 when the count value is larger than the desired value. Thus, the output sampling signal Fs of the VCO 26 is synchronized with the SYNC signal, and has its frequency converged to a value determined by the desired value of the count value.

Figure 10:
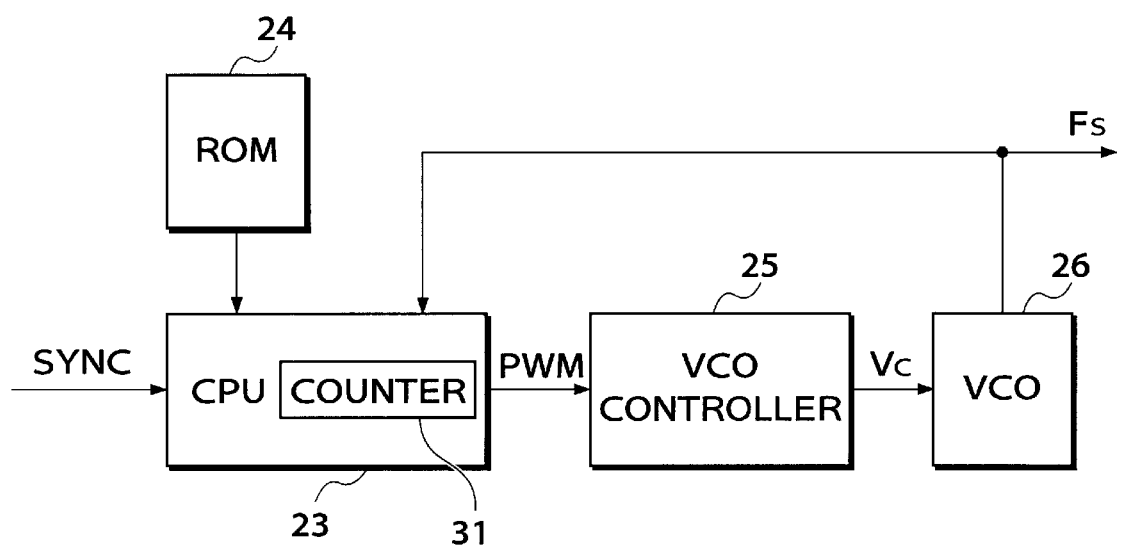
FIG. 10 is a circuit diagram showing the configuration of a frequency control apparatus according to a third embodiment of the invention.

FIG. 10 shows the configuration of a frequency control apparatus according to a third embodiment of the invention. In FIG. 10, elements corresponding to those in FIG. 9 are designated by identical reference numerals.

The frequency control apparatus according to the third embodiment is not supplied with data from an external device, but only supplied with a SYNC signal as a timing signal. In this embodiment, the CPU 23 has an internal counter 31 whose count value is used as a monitor amount. The manner of controlling the output frequency of the VCO 26 is identical with that of the apparatus of FIG. 9.

This embodiment is useful for an application where data stored in the apparatus 2 which operates in synchronism with the output of the computer 1 are read under timing control by the computer 1.

According to the present invention, all the processes can be implemented by software. To this end, a frequency control program may be used, which includes an output frequency varying process and an output frequency control process. The output frequency varying process may be implemented by an oscillation process for varying the frequency of the output sampling signal Fs based on a controlled variable using a timer. The output frequency control process may comprise checking a monitor amount variable depending upon the output sampling signal Fs in timing of inputting a timing signal or SYNC signal as a reference signal for synchronization from an external device, determining a difference between the checked monitor amount and a predetermined desired amount, and controlling the output frequency of the VCO, i.e., the frequency of the output sampling signal Fs so as to make the difference zero. Such a program may be recorded in a storage medium such as a FD or CD-ROM, and be supplied therefrom, or alternatively may be supplied from an external device via a suitable communication medium.

In the above described first embodiment, the apparatus of FIG. 2 employs a two-stage data storage means composed of the FIFO 11 and the buffer 12. This is to cope with large frequency changes, that is, to avoid data stored in the buffer from becoming missing even when the output frequency is higher than a reference frequency. The reference frequency corresponds to the number of input data, and consequently, setting of the output frequency at the start of transmission of data to the apparatus can entail a relatively large change in the output frequency. The apparatus of FIG. 2 is capable of fully coping with such a large change in the output frequency. In the case where there is a very low possibility that the above-mentioned problem occurs, the buffer 12 may be omitted, and the residual amount of data stored in the FIFO 11 may be used as the monitor amount.

Figure 11:
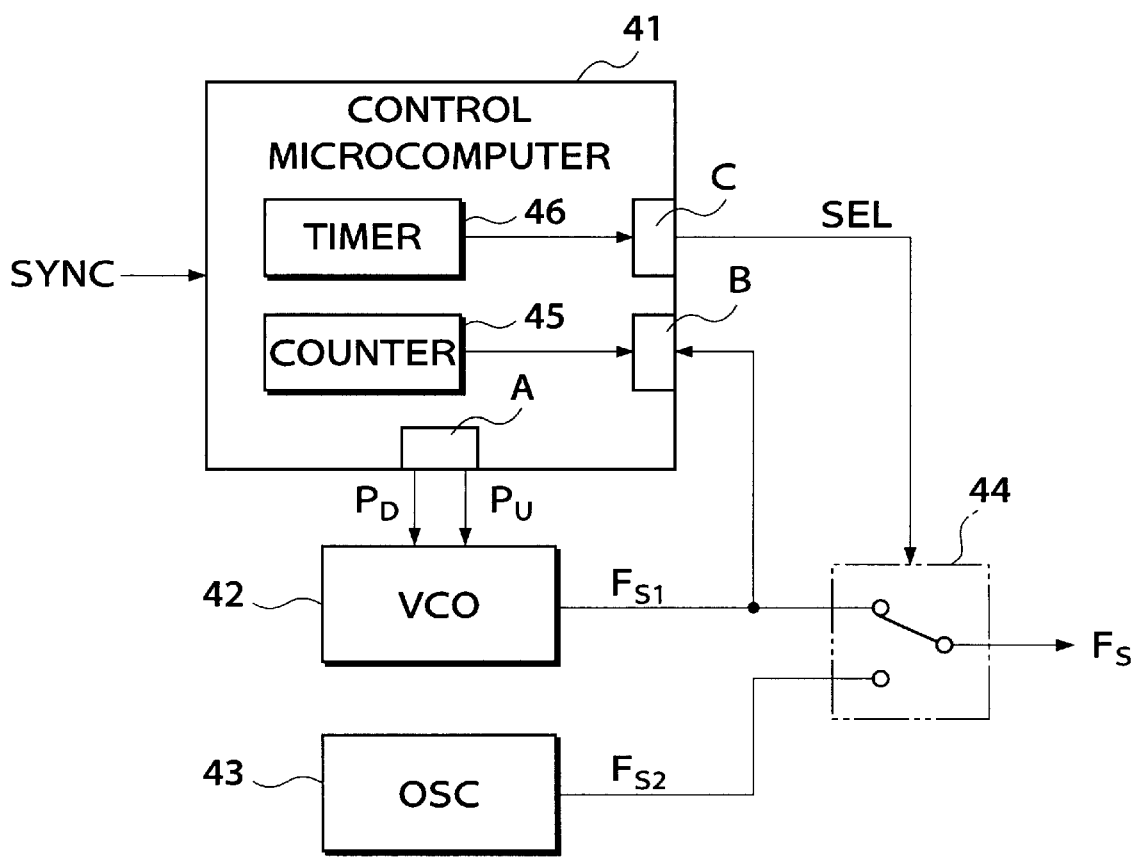
FIG. 11 is a circuit diagram showing the configuration of a frequency control apparatus according to a fourth embodiment of the invention.

FIG. 11 shows the configuration of a frequency control apparatus according to a fourth embodiment of the invention.

The frequency control apparatus according to the fourth embodiment comprises of a control microcomputer (hereinafter referred to as "the control computer") 41 as frequency control means, a VCO 42 as a variable frequency oscillator, an oscillator (hereinafter referred to as "the OSC") 43 as a fixed frequency oscillator, and a switch 44 for switching between an output of the VCO 42 and an output of the OSC 43. The control computer 41 includes a counter 45 and a timer 46 provided therein, and is provided with three ports A, B, and C. The counter 45 counts an output Fs1 from the VCO 42 input through the port B. The control computer 41 reads the count value of the counter 45 in timing in which a SYNC signal is input if the SYNC signal is supplied from an external device, and in timing in which a clock is generated inside the control computer, compares the read count value with a desired value stored in a RAM (not shown) provided therein, and controls the output frequency of the VCO 42 by generating an up pulse $P_U$ or a down pulse $P_D$ based on results of the comparison and delivering the up or down pulse to the VCO 42. The timer 46 generates a selection signal SEL for switching the switch 44 through the port C when the SYNC signal has not been input to the control computer 41 over a predetermined time period.

Figure 12:
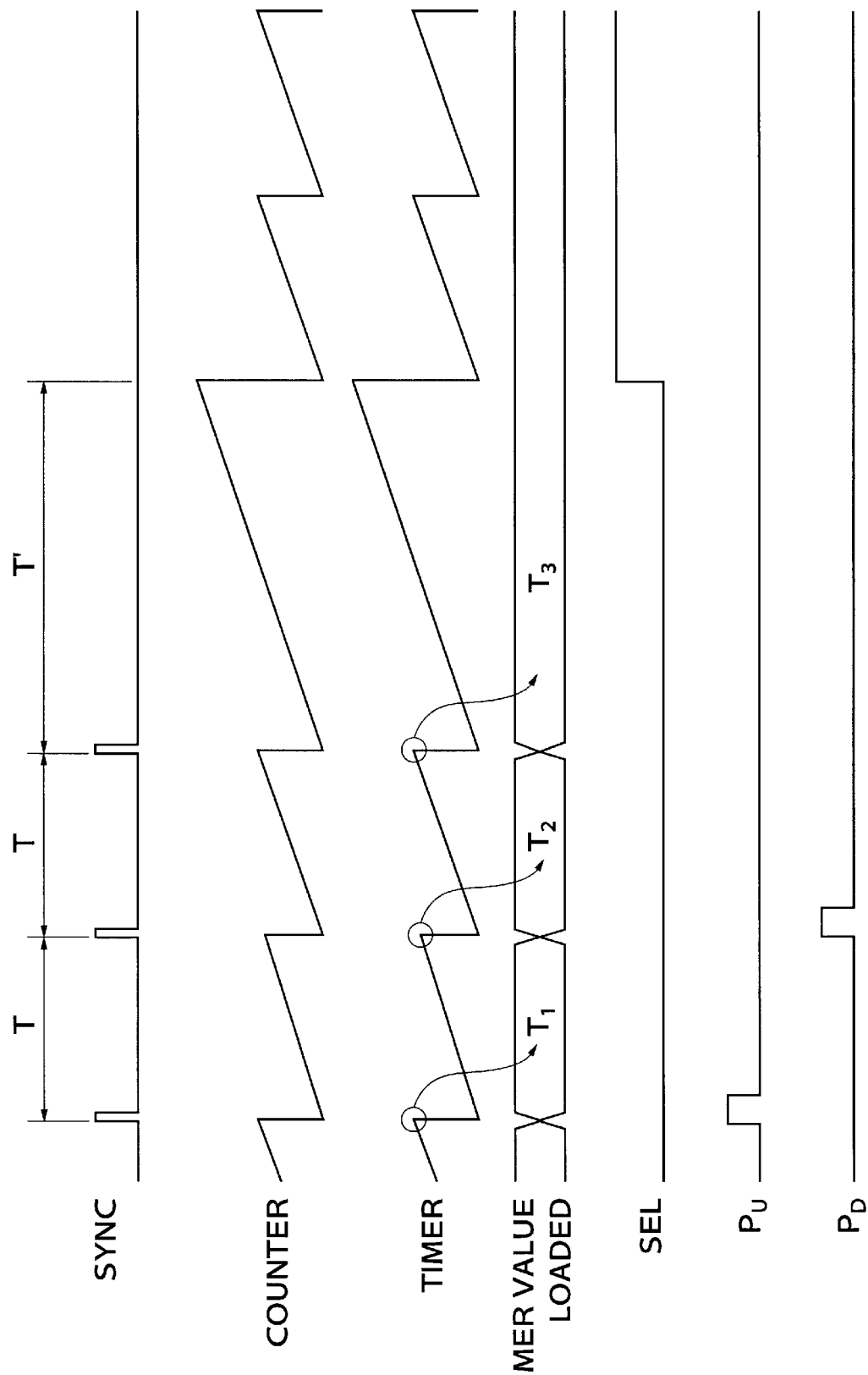
FIG. 12 is a timing chart showing a synchronizing signal input to the frequency control circuit of FIG. 11 and changes in states of devices of the same.

FIG. 12 shows the SYNC signal input to the control computer 41 and changes in the count values of the counter 45 and the timer 46, etc.

When the SYNC signal is input to the control computer 41 at regular time intervals corresponding to the period T, an up pulse $P_U$ or a down pulse $P_D$ is generated based on the difference between the count value of the counter 45 read at the time of inputting of the SYNC signal, and the desired value and the frequency of the output signal Fs1 of the VCO 42 is controlled so as to be synchronized with the SYNC signal. On this occasion, the switch 44 is positioned to select the output of the VCO 42, so that the output signal Fs1 of the VCO 42 is output as an output signal Fs. At the time of inputting of the SYNC signal, the value of the timer 46 is loaded in the RAM and the timer 46 is reset. The timer value loaded in the RAM is updated each time the SYNC signal is input. That is, the timer 46 as well as the counter 45 is reset each time their values are checked and loaded.

In the event that no SYNC signal is input to the computer 1 due to, for example, the turning-off of the power supply to the computer 1 so that the timer 36 counts up a predetermined time period T', the level of the selection signal SEL changes such that the switch 44 switches from the output of the VCO 42 to the output of the OSC 43, whereby an output signal Fs2 having a fixed frequency from the OSC 43 is selected as the output signal Fs. Since the value of the timer 46 loaded when the SYNC signal was last input is loaded in the RAM inside the control computer 41, this loaded value of the timer 46 is adopted as the period with which the difference between the count value of the counter 45 and the desired value is monitored to continue the control of the VCO 42. The reason why the control of the VCO 42 continues is that if the VCO 42 is not controlled at all, a leak current flowing in the VCO will cause the output frequency of the VCO to gradually vary. In this way, when the SYNC signal is subsequently again input, a prompt signal entering operation can be assured. If the predetermined time period T' is set to an integer multiple of the period T of the SYNC signal, the timing of starting the synchronization using the value of the internal timer 46 can be made to coincide with the timing in which the SYNC signal was input to thereby enable the synchronizing control to be continued without a change in the phase of the output signal Fs1 of the VCO 42.

Figure 13:
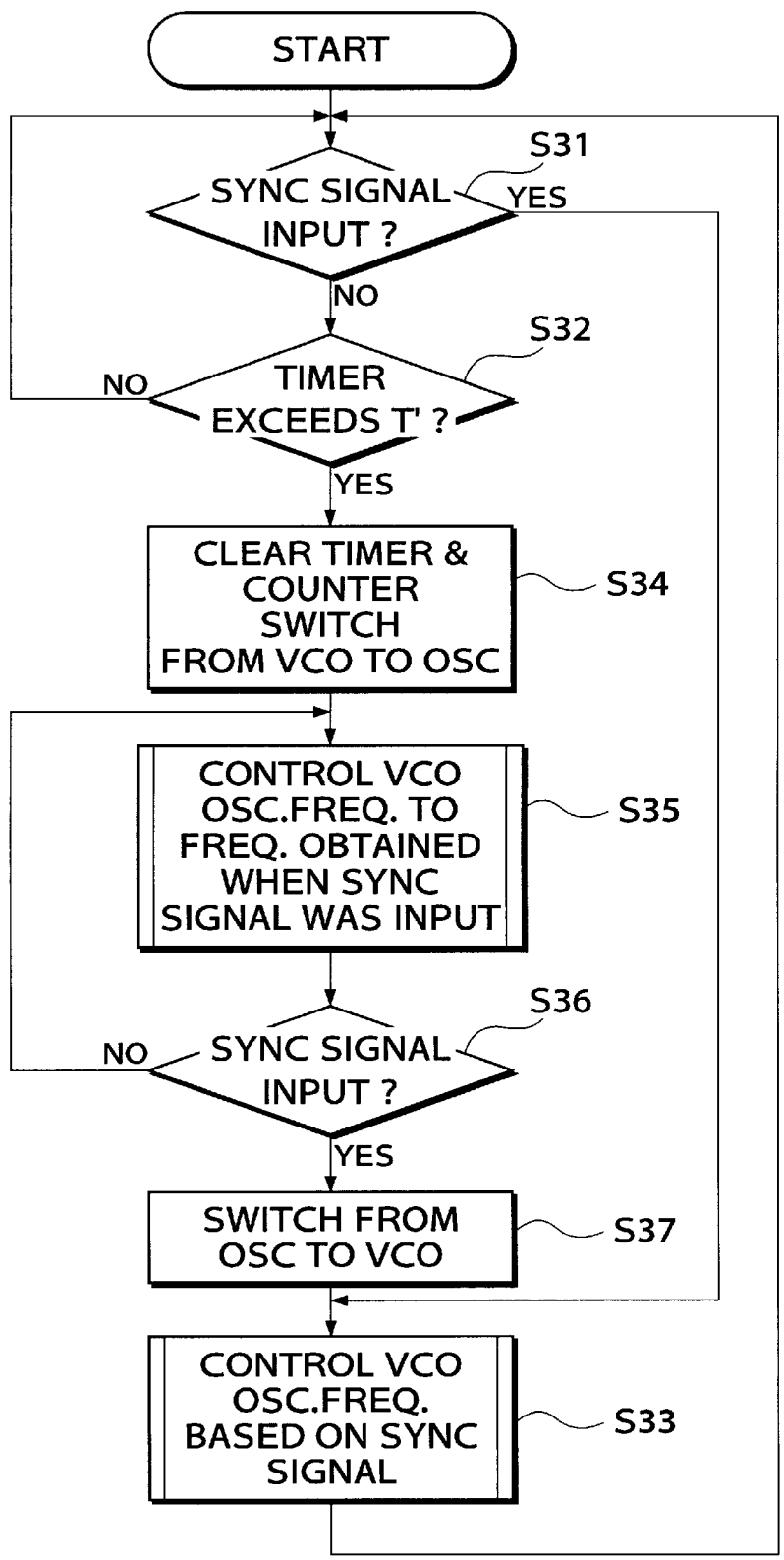
FIG. 13 is a flowchart showing a frequency control routine executed by the frequency control circuit of FIG. 11.

FIG. 13 shows a routine for carrying out the above described frequency control according to the fourth embodiment.

First, it is determined whether or not the SYNC signal is being inputted, i.e. the presence of the SYNC signal input is checked at a step S31. If the SYNC signal is not being inputted, the checking of the presence of the SYNC signal input is carried out repeatedly so long as the timer 46 does not count up to the predetermined time period T', at a step S32. If the presence of the SYNC signal input is detected, the output frequency of the VCO 42 is controlled based on the SYNC signal at a step S33.

Figure 14:
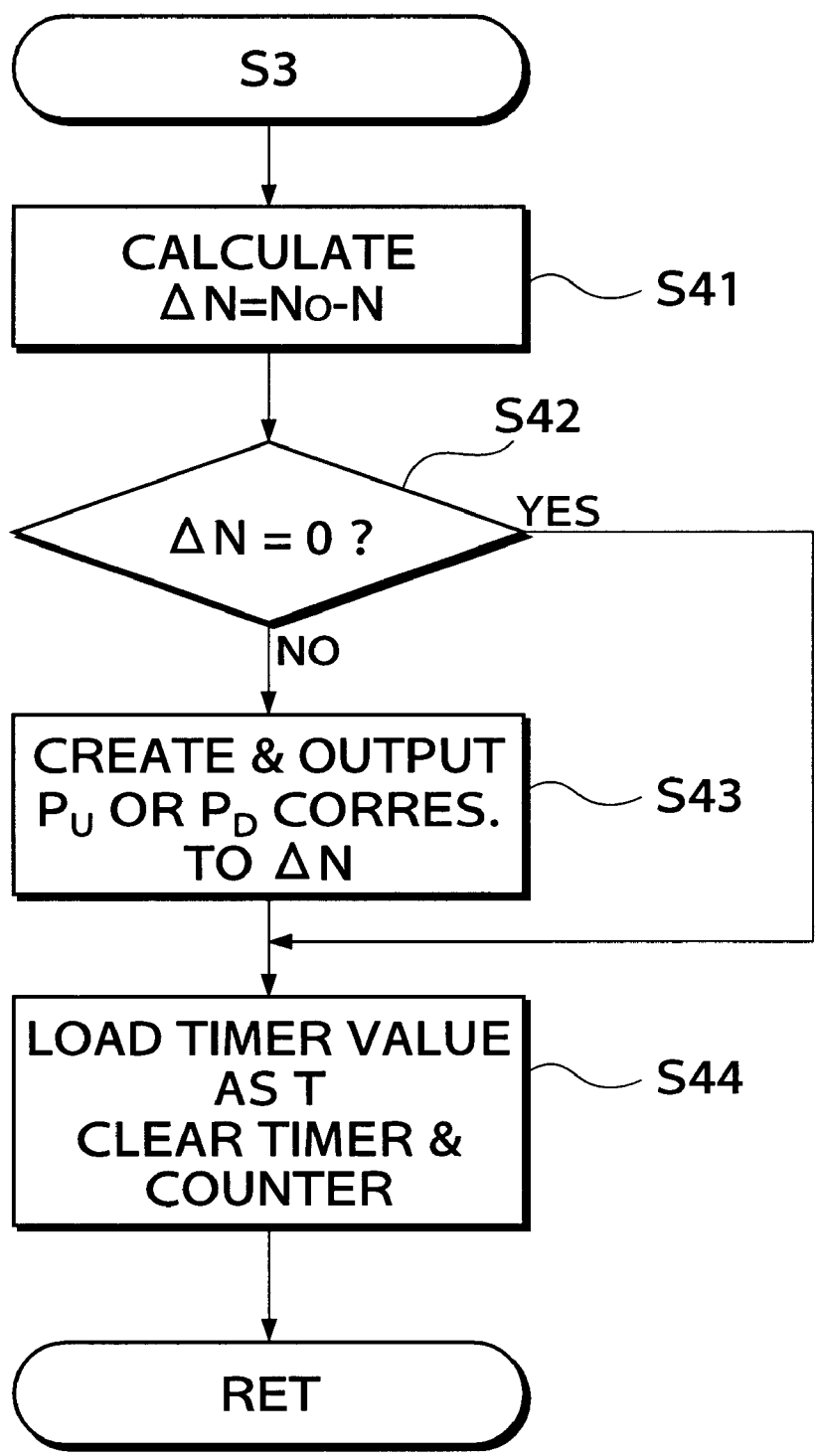
FIG. 14 is a flowchart showing a control routine for controlling a VCO when the synchronizing signal is input, which is executed at a step S33 of the frequency control routine of FIG. 13.

FIG. 14 shows a routine for controlling the VCO when the synchronizing signal is input, which is executed at the step S33 of FIG. 13.

First, the difference ΔN between the count value N of the counter 45 and the desired value $N_0$ is calculated at a step S41. The desired value $N_0$ is stored in the RAM or a register within the control computer 41. It is checked whether or not the difference ΔN is equal to 0 at a step S42. If it is not equal to 0, a pulse $P_U$ or $P_D$ having a suitable pulse width depending upon the difference N is created and output through pulse width modulation (PWM) at a step S43, whereas if it is equal to 0, no pulse is created and output. Then, the value of the timer 46 is loaded as the period T in the RAM, and the values of the counter 45 and the timer 46 are cleared at a step S44.

If it is determined that the value of the timer 46 exceeds the predetermined time period T' at the step S32 of FIG. 13, the values of the counter 45 and the timer 46 are cleared, and the output signal Fs is switched from the output Fs1 of the VCO 42 to the output Fs2 of the OSC 43 at a step S34. Then, the oscillation frequency of the VCO 42 is controlled to the frequency obtained with the last SYNC signal. That is, the value of the counter 45 is checked with a period equal to the timer value loaded as the period T to thereby control the VCO 42 at a step S35.

Figure 15:
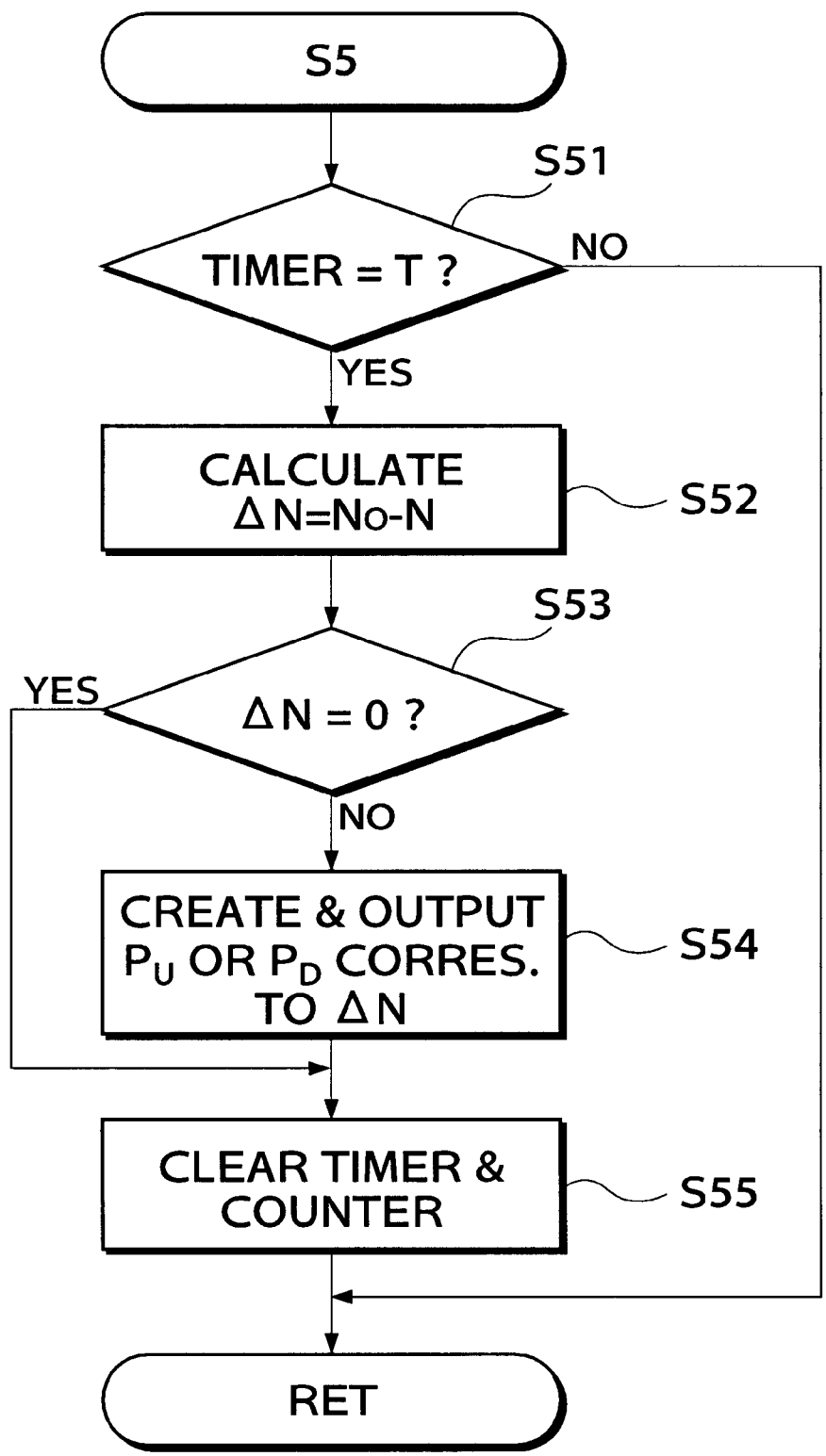
FIG. 15 is a flowchart showing a control routine for controlling the VCO when the synchronizing signal is not input, which is executed at a step S35 of the frequency control routine of FIG. 13.

FIG. 15 shows a routine for controlling the VCO 42 when the SYNC signal is not input, which is executed at the step S35 of FIG. 13.

First, it is determined at a step S51 whether or not the value of the timer 46 is equal to the value of the period T. If the former is equal to the latter, it is regarded that a virtual synchronizing signal is input in appropriate timing. If the former is not equal to the latter, it is regarded that the virtual synchronizing signal is not input in appropriate timing. Therefore, only when the value of the timer 46 is equal to the period T, the difference ΔN between the value N of the counter 45 and the desired value $N_0$ is calculated at a step S52. It is checked whether or not the calculated difference ΔN is equal to 0 at a step S53. If it is not equal to 0, a pulse $P_U$ or $P_D$ having a suitable pulse width depending upon the difference ΔN is created and output through PWM at a step S54. If it is equal to 0, no pulse is created and output. Then, the value of the timer 46 is loaded in the RAM and the values of the counter 45 and the timer 46 are cleared at a step S55.

Referring again to FIG. 13, when the process of the step S35 is terminated, the presence of the SYNC signal input is checked at a step S36. So long as no SYNC signal input is detected, the above process is executed repeatedly. However if the SYNC signal input is detected, the output signal Fs is switched from the output Fs2 of the OSC 43 to the output Fs1 of the VCO 42 at a step S37, and then the oscillation frequency of the VCO 42 is controlled with reference to the SYNC signal at a step 33.

Thus, by switching between the output of the VCO 42 and the output of the OSC 43 depending upon the presence of the SYNC signal input, the apparatus 2 can be selectively used as a PC sound source controlled by the computer 1 in FIG. 1 and as an independent audio stereo apparatus. This manner of use has the following advantage: That is, for a PC sound source, in many cases the capacity is regarded as more important than the sound quality, and therefore various combinations of the sampling frequency Fs (e.g. 11.025 kHz, 22.05 kHz, and 44.1 kHz) and the resolution (e.g. 8 bits and 16 bits) can be applied. In contrast, for an audio stereo apparatus, the sound quality is important, and therefore only limited combinations of the sampling frequency Fs (44.1 kHz and 48 kHz) and the resolution (16 bits and 20 bits) can be applied. Therefore, in the case where the apparatus 2 is used in connection with the computer 1, it is advantageous to use the VCO 42 which can cope with a wide range of frequency, while in the case where the apparatus 2 is used as an independent audio stereo apparatus, high quality sounds can be expected if an oscillator having a fixed oscillation frequency and hence high reliability is used.

Figure 16A:
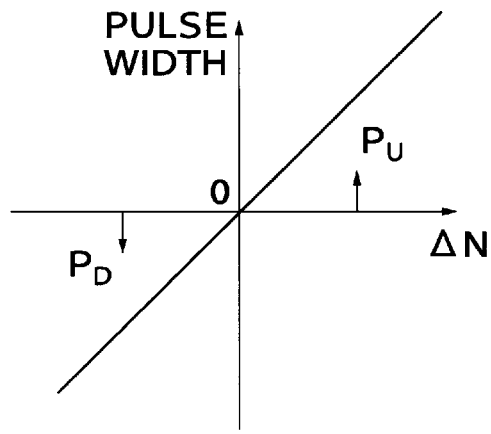
Figure 16B:
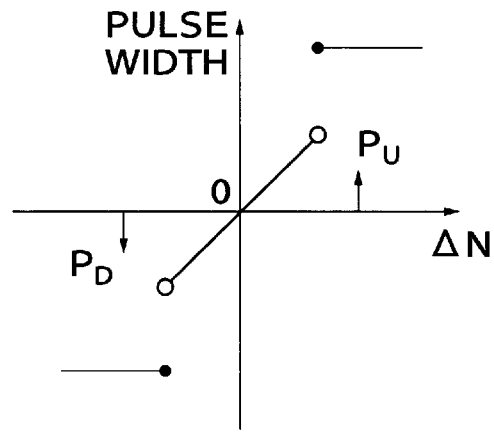

The up pulse PU and down pulse PD generated by the control computer 41 vary in pulse width in a linear manner in response to the difference $\Delta N$, as shown in FIG. 16A. Alternatively, they may vary in a non-linear manner such that when the difference $\Delta N$ exceeds a certain range, the pulse width is held at a maximum level, as shown in FIG. 16B. This has an advantage of further shortening the input signal entering time. In FIG. 16B, the right side (in the positive direction of $\Delta N$) shows the output range of the up pulse $P_U$, and the left side (in the negative direction of $\Delta N$) shows the output range of the down pulse $P_D$. If the pulse width is determined from a table, the control computer 41 may store only a table of the pulse width to $\Delta N$ relationship shown in the first quadrant of the FIGS. 16A or 16B graph. An absolute value $|\Delta N|$ of the difference $\Delta N$ is obtained. The up pulse or the down pulse is selected to determine its pulse width depending upon the sign of the difference $\Delta N$, whereby the storage capacity required for storing the table can be reduced to half.

Figure 17A:
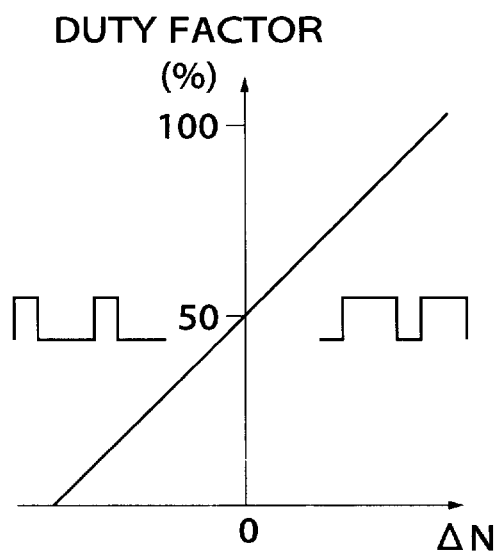
Figure 17B:
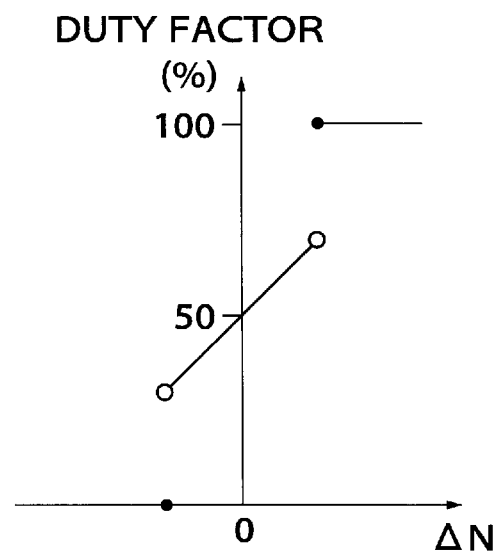

Further, instead of the up and down pulses $P_U$, $P_D$, a pulse whose duty factor that varies from 0% to 100% as the difference $\Delta N$ changes from its minimum value to its maximum value may be used as a control signal for controlling the VCO 42, as shown in FIGS. 17A and 17B. This way, the VCO 42 can be controlled only by the use of a single control signal and hence the number of ports of the control computer 41 can be reduced.

Figure 18:
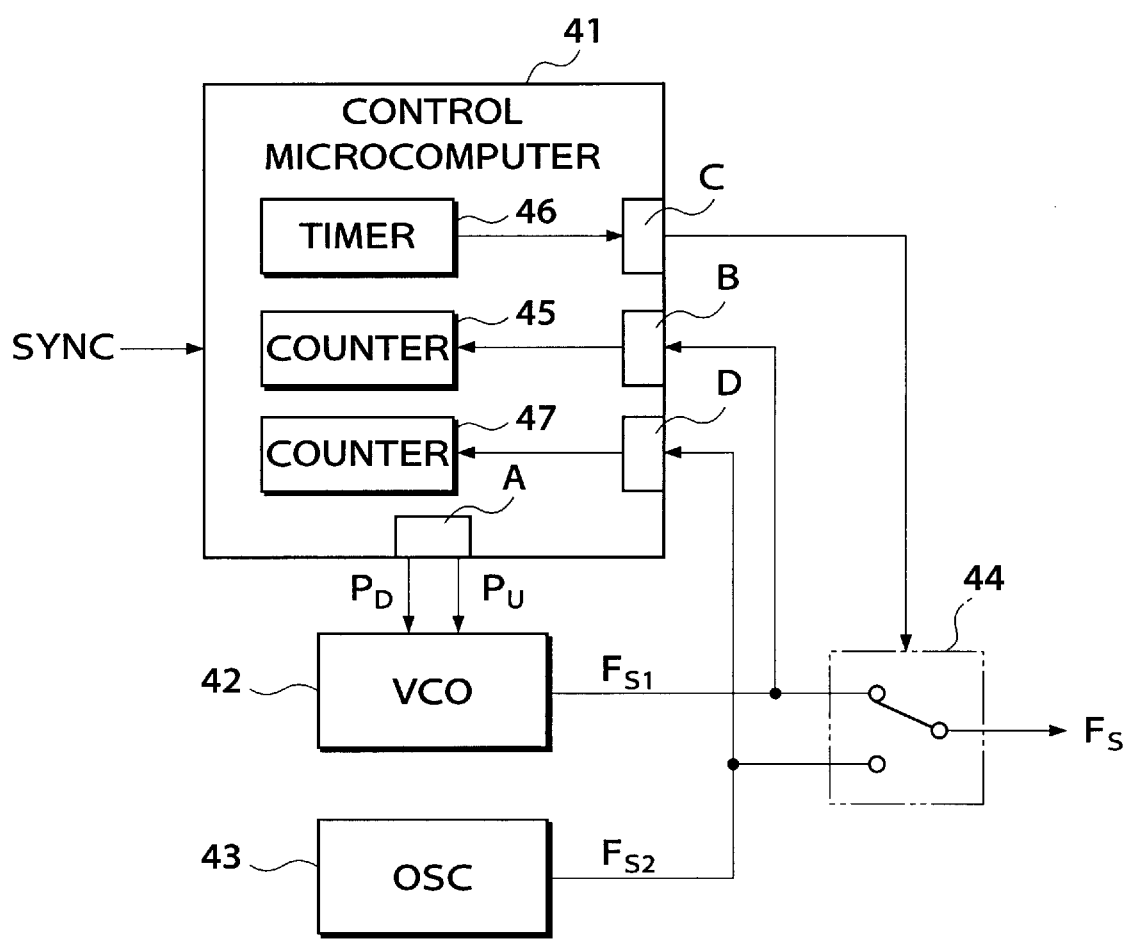
FIG. 18 is a circuit diagram showing the configuration of a frequency control apparatus according to a fifth embodiment of the invention.

FIG. 18 shows the configuration of a frequency control apparatus according to a fifth embodiment of the invention.

In the fifth embodiment, an additional counter 47 is provided in the control computer 41, which receives the output Fs2 of the OSC 43 to measure the period of the SYNC signal. The value of the counter 47 is loaded in the RAM as the period T. In other points, the frequency control apparatus according to this embodiment operates similarly to the apparatus of FIG. 11, details of which is omitted.

Figure 19:
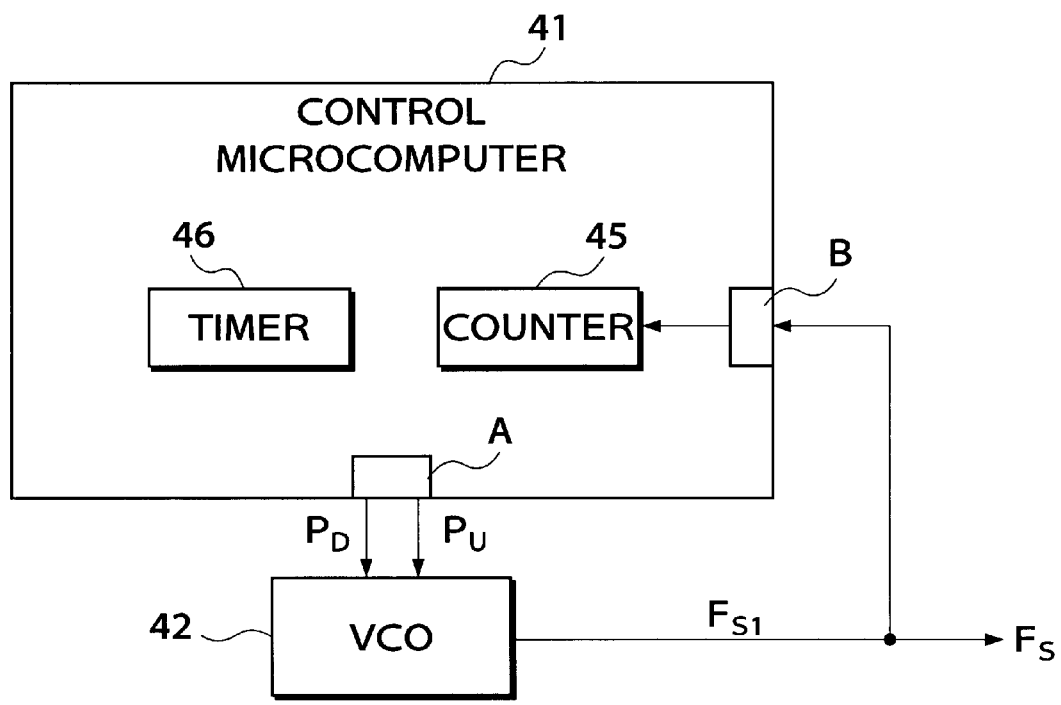
FIG. 19 is a circuit diagram showing the configuration of a frequency control apparatus according to a sixth embodiment of the invention.

FIG. 19 shows the configuration of a frequency control apparatus according to a sixth embodiment of the invention.

In the sixth embodiment, an OSC as a fixed frequency oscillator is not used, but when the SYNC signal is not input, the output signal Fs1 of the VCO 42 which is frequency-controlled is used as the output signal. The frequency control process carried out by the apparatus of FIG. 19 does not include the process for switching between the VCO 42 and the OSC 43 executed at the steps S34 and S37 of FIG. 13. Even with this construction, it is possible to use the output of the VCO 42 as the output of a fixed frequency oscillator when the SYNC signal is not input.

In the fourth to sixth embodiments as well, all the processes described above can be implemented by software. To this end, the frequency control program may include an output frequency varying process and an output frequency control process. The output frequency varying process may be implemented by an oscillation process for varying the frequency of the output sampling signal Fs1 based on a controlled variable using a timer. The output frequency control process may be constructed such that when the SYNC signal is input from an external device, the period T of the SYNC signal is stored, a count value obtained by counting the output signal Fs1 in timing in which the SYNC signal is input from the external device is checked, a difference between the checked count value and a predetermined desired value is determined, and the frequency of the output signal Fs1 is controlled so as to make zero the difference. When the SYNC signal is not input from the external device, the count value checked at time intervals corresponding to the period T which is stored, and the frequency of the output signal Fs1 is controlled in a similar manner to the above. Such a program may be recorded in a storage medium such as a FD or a CD-ROM, and be supplied therefrom, or alternatively may be supplied from an external device via a suitable communication medium.

The present invention is not limited to the above described embodiments. For example, although in the apparatus of FIG. 11, only one OSC 43 is provided, a plurality of OSC's having respective different output frequencies may alternatively be provided, which are selected for use according to application.

What is claimed is:

1. A frequency control apparatus for controlling a frequency of an output signal thereof in synchronism with an externally input timing signal, comprising:

a variable frequency oscillator that varies said frequency of the output signal in response to an input control signal input to said variable frequency oscillator and outputs the output signal;

an input device that receives said timing signal;

a checking device that checks a monitor amount which is variable in response to said frequency of the output signal from said variable frequency oscillator, in synchronism with said input timing signal;

a calculating device that calculates a difference between the checked monitor amount and a predetermined desired amount; and an input control signal output device that generates said input control signal for decreasing said calculated difference and outputs said generated input control signal to said variable frequency oscillator.

2. A frequency control apparatus as claimed in claim 1, including a counter device that counts said monitor amount to output a count value, wherein said checking device checks said count value output from said counter device.

3. A frequency control apparatus as claimed in claim 1, wherein said input control signal output device generates a pulse width controlled signal having a pulse width which varies based on the calculated difference between the checked monitor amount and said predetermined desired amount, said pulse width controlled signal being delivered to said variable frequency oscillator as said input control signal.

4. A frequency control apparatus as claimed in claim 1, wherein said input control signal output device controls said input control signal such that the frequency of said output signal from said variable frequency oscillator varies linearly in response to the calculated difference between the checked monitor amount and said predetermined desired amount.

5. A frequency control apparatus as claimed in claim 1, wherein said input control signal output device controls said input control signal such that the frequency of said output signal from said variable frequency oscillator varies non-linearly in response to the calculated difference between the checked monitor amount and said predetermined desired amount.

6. A frequency control apparatus as claimed in claim 1, wherein said predetermined desired amount is variable.

7. A frequency control apparatus as claimed in claim 1, wherein said input control signal output device generates a pulse width controlled signal having a pulse width which varies based on the calculated difference between the checked monitor amount and said predetermined desired amount, said pulse width controlled signal being utilized to generate another signal that is delivered to said variable frequency oscillator as said input control signal.

8. A frequency control method for controlling a frequency of an output signal in synchronism with an externally input timing signal, comprising the steps of:

varying said frequency of the output signal in response to an input control signal and outputting the output signal;

receiving said timing signal;

checking a monitor amount which is variable in response to said frequency of the output signal from said varying output frequency step, in synchronism with said input timing signal;

calculating a difference between the checked monitor amount and a predetermined desired amount; and generating said input control signal for decreasing said calculated difference and outputting said generated input control signal.

9. A mechanically readable storage device that stores a program for carrying out a frequency control method for controlling a frequency of an output signal in synchronism with an externally input timing signal, said method comprising the steps of:

varying said frequency of the output signal in response to an input control signal and outputting the output signal;

receiving said timing signal;

checking a monitor amount which is variable in response to said frequency of the output signal from said varying output frequency step when said timing signal is input;

calculating a difference between the checked monitor amount and a predetermined desired amount; and generating said input control signal for decreasing said calculated difference and outputting said generated input control signal.

10. A frequency control apparatus for controlling a frequency of an output signal thereof in synchronism with an externally input timing signal, comprising:

a variable frequency oscillator means for varying said frequency of the output signal in response to an input control signal input to said variable frequency oscillator and outputting the output signal;

an input means for receiving said timing signal;

a checking means for checking a monitor amount which is variable in response to said frequency of the output signal from said variable frequency oscillating means, in synchronism with said input timing signal;

a calculating means for calculating a difference between the checked monitor amount and a predetermined desired amount; and an input control signal output means for generating said input control signal for decreasing said calculated difference and outputting said generated input control signal to said variable frequency oscillating means.

11. A frequency control apparatus for controlling a frequency of an output signal thereof in synchronism with an externally input timing signal, comprising:

a variable frequency oscillator that varies said frequency of the output signal in response to an input control signal input to said variable frequency oscillator and outputs the output signal;

an input device that receives said timing signal;

a checking device that checks a monitor amount which is variable in response to said frequency of the output signal from said variable frequency oscillator, in synchronism with said input timing signal;

a comparison device that compares the checked monitor amount with a predetermined desired amount; and an input control signal output device that generates said input control signal for decreasing the checked monitor amount if it is greater than the predetermined amount or increasing the checked monitor amount if it is smaller than the predetermined amount, and outputs said generated input control signal to said variable frequency oscillator.

12. A frequency control apparatus as claimed in claim 11, including a counter device that counts said monitor amount to output a count value, wherein said checking device checks said count value output from said counter device.

13. A frequency control apparatus as claimed in claim 11, wherein said input control signal output device generates a pulse width controlled signal having a pulse width which varies based on the comparison between the checked monitor amount and said predetermined desired amount, said pulse width controlled signal being delivered to said variable frequency oscillator as said input control signal.

14. A frequency control apparatus as claimed in claim 11, wherein said input control signal output device controls said input control signal such that the frequency of said output signal from said variable frequency oscillator varies linearly in response to the comparison between the checked monitor amount and said predetermined desired amount.

15. A frequency control apparatus as claimed in claim 11, wherein said input control signal output device controls said input control signal such that the frequency of said output signal from said variable frequency oscillator varies non-linearly in response to the comparison between the checked monitor amount and said predetermined desired amount.

16. A frequency control apparatus as claimed in claim 11, wherein said input control signal output device generates a pulse width controlled signal having a pulse width which varies based on the comparison between the checked monitor amount and said predetermined desired amount, said pulse width controlled signal being utilized to generate another signal that is delivered to said variable frequency oscillator as said input control signal.

17. A frequency control apparatus as claimed in claim 11, wherein said predetermined desired amount is variable.

* * * * *